United States Patent [19]

Farina

[11] 4,110,666
[45] Aug. 29, 1978

[54] CIRCUIT FOR GENERATING A SAW TOOTH WAVEFORM

[75] Inventor: Attilio Farina, Turin, Italy

[73] Assignee: Indesit Industria Elettrodomestici Italiana S.p.A., Italy

[21] Appl. No.: 747,145

[22] Filed: Dec. 3, 1976

[30] Foreign Application Priority Data

Dec. 11, 1975 [IT] Italy ............................. 70041 A/75

[51] Int. Cl.² .............................................. H01J 29/70
[52] U.S. Cl. ..................................... 315/408; 315/399
[58] Field of Search ................ 315/408, 399, 410, 407

[56] References Cited

U.S. PATENT DOCUMENTS

| | | | |
|---|---|---|---|
| 3,449,623 | 6/1969 | Dietz | 315/408 |
| 3,778,670 | 11/1973 | Nagai | 315/408 |
| 3,784,871 | 1/1974 | Vacher | 315/408 |
| 3,950,673 | 4/1976 | Gries | 315/408 |

Primary Examiner—Maynard R. Wilbur
Assistant Examiner—Lawrence Goodwin
Attorney, Agent, or Firm—Sughrue, Rothwell, Mion, Zinn and Macpeak

[57] ABSTRACT

A circuit for generating a saw tooth waveform in a coil such as the deflection coil of a television picture tube, comprising a first circuit branch including a capacitor serving as an energy storing current source and a controllable rectifier, and a second circuit branch including another current source, a second controllable rectifier and a resonant circuit comprising two reactances, constituted by an inductance and a capacitor which are connected in circuit by the second controllable rectifier and act to draw current from the two sources away from the deflection coil when the second controllable rectifier is fired whereby to initiate the flyback portion of the saw tooth waveform.

9 Claims, 1 Drawing Figure

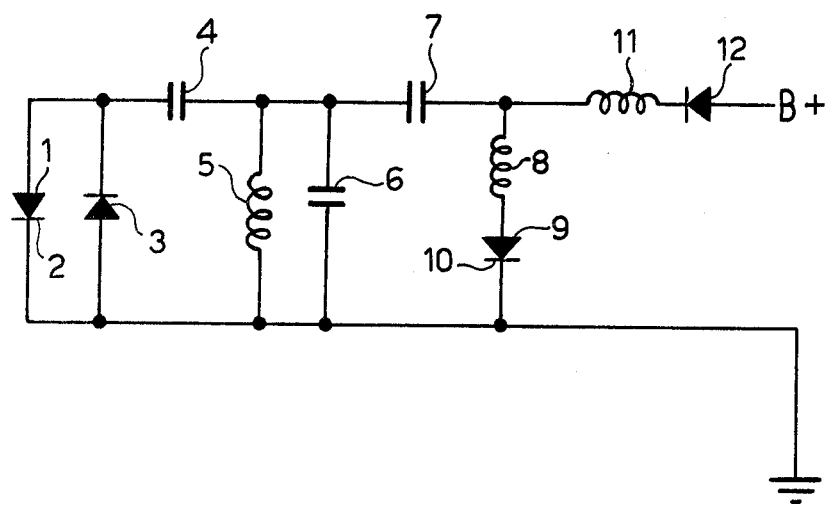

CIRCUIT FOR GENERATING A SAW TOOTH WAVEFORM

The present invention relates to a circuit for generating a saw-tooth waveform, and in particular to such a circuit suitable for generating a saw-tooth waveform in a deflection coil of a cathode ray tube for the purpose of the deflection of the electron beam therein. In embodiments of the present invention energy is transferred to a deflection coil by means of solid state semi-conductor devices, for example silicon controlled rectifiers.

Since the present invention finds particular utility in connection with the horizontal deflection circuits of television receivers, it will be particularly described with reference to its use in such apparatus, although it will be appreciated that its uses are by no means limited to such applications.

In the completely transistorised television receivers now on the market one of the most critical sections, from the point of view of the degree of reliability and economy of the receiver, is that for the horizontal deflection of the electron beam in the cathode ray tube.

For the purpose of avoiding the characteristic limitations imposed on the current and the voltage of transistor deflection circuits, a number of different circuits have been proposed using silicon controlled rectifiers (also known as "SCR devices") which are formed of a semi-conductor assembly capable of operating with higher currents than is the case with normal transistors.

Some of the previously proposed deflection circuits using silicon controlled rectifiers, are adapted to be driven by the flyback pulse of a television signal, in such a way that a single silicon controlled rectifier can be connected to a supply source during a part of the flyback time, which is of relatively short duration with respect to the corresponding deflection cycle of the system. This makes it possible to replenish the energy dissipated in the associated deflection yoke, or in the corresponding winding, during the scan part of the cycle. However, a circuit driven by the flyback pulse generally has a smaller efficiency value with respect to that of a normal circuit driven by the scan pulse, which is generally used in transistor deflection systems, or indeed in deflection systems using thermonic valves.

In a circuit driven by the flyback pulse a unidirectional current of relatively high value flows through the silicon controlled rectifier and through the associated deflection components during the scan time. For instance, during the scan time a unidirectional deflection current which is variable in a substantially linear manner is fed through a diode. The resultant unidirectional current, of relatively high value, produces an undesirable loss of power in the resistive components which are associated with the deflection system.

A deflection circuit using two bi-directional electronic switches, each formed of a silicon controlled rectifier and a diode connected in anti-parallel, is described in British Pat. No. 1.200.460. This circuit, which had certain disadvantages, was subsequently improved (see, for example, U.S. Pat. No. 3,452,244) to make it more practicable.

In general, however, this circuit still has some disadvantages in that it is rather complicated and is subject to failure in certain conditions (for example, if the deflection coil becomes disconnected).

The present invention seeks therefore to provide a saw-tooth waveform generator of improved type suitable for use in a horizontal deflection circuit of a cathode ray tube, particularly a television picture tube.

According to the present invention there is provided a circuit for generating a periodic saw-tooth waveform in a coil, such as the deflection coil of a television picture tube, in which the coil is connected, in a first branch of the circuit, to an energy storing current source, through a first bi-directionally conductive electronic switch having a control electrode which is connected to a source of control pulses, which make the switch conductive during a part of the ramp portion of the saw-tooth waveform, there being a second branch of the circuit which contains a second current source and a first reactance which during the middle part of the ramp of the saw-tooth waveform, with the first switch closed, receives energy from the second current source, in which the return portion of the saw-tooth waveform is initiated by means of a second electronic switch which towards the end of the ramp portion of the saw-tooth switches to connect circuit components to form a resonant circuit, which substantially comprises the said first reactance and a second reactance, connected between the said second source of current and the said second electronic switch.

One embodiment of the present invention will now be more particularly described, by way of example, with reference to the accompanying drawing, which is a schematic circuit diagram of a horizontal deflection circuit for a television picture tube.

In the drawing there is shown a silicon controlled rectifier (SCR or Thyristor) 1, having a gate electrode 2. The SCR 1 is connected in anti-parallel with a diode 3. The anode of the controlled rectifier 1 is connected to a scan capacitor 4, which has, for example a value of $1.8\mu F$, and the cathode of the controlled rectifier 1 is connected to earth.

The scan capacitor 4 is also connected to a coil 5 and a flyback capacitor 6 which are connected in parallel with one another to earth. The coil 5 is the deflection coil of the horizontal deflection circuit of a television picture tube and is typically 300 $\mu H$; the capacitor 6 is typically 47 nF.

To the junction between the scan capacitor 4 and the flyback capacitor 6 is connected one terminal of a capacitor 7 (for example of capacity 100 nF) the other terminal of which is connected to a coil 11 and to a coil 8. The coil 11, the value of which is, for example, 2 mH, is connected by the other terminal to a d.c. input source B+, via a diode 12 which serves to prevent reverse flow of current from the circuit towards the input source B+.

The coil 8, the value of which is, for example; 100 $\mu H$, is connected between the junction of the capacitor 7 and the coil 11 and the anode of a second controlled rectifier 9 having a gate electrode 10, and the cathode of which is connected to earth.

The circuit described above operates as follows:

To the gate electrodes 2 and 10 of the controlled rectifiers 1 and 9 are applied positive gate pulses which are obtained in a known manner (not shown); these are in synchronism with the television signal received in that the pulse applied to the electrode 10 starts a few microseconds (for example 8 $\mu s$) before the end of the line scan and can last from 2 to 8 microseconds (the duration is not critical); and the pulse applied to the electrode 2 starts a few microseconds after the start of the line scan (for example 10 microseconds) and lasts from 20 to 30 microseconds (here too the duration is not critical). The particular means of generating these pulses may be one of a variety well known in the art and does not constitute a part of the present invention. A detailed explanation of one method of generating these pulses may be found in the above referenced U.S. Pat. No. 3,452,244 or in U.S. Pat. No. 3,449,623, both of which describe beam deflection circuits, the former being an improvement on the latter.

At the start of the scan time the diode 3 is conducting, and the rectifier 1 and the rectifier 9 are not conducting, as will be seen. The current in the coil 5 increases linearly due in part to the energy stored in the capacitor 4 and in part to the energy stored in the capacitor 7.

A few microseconds after the start of the line scan the rectifier 1 is fired by the gate pulse described. The current in the coil 5 at a certain point reaches zero and reverses polarity; at this point the controlled rectifier 1 becomes forward biased and therefore conductive and the diode 3 becomes non-conductive.

At the junction between the capacitor 7 and the impedance coil 11 the voltage rises to a maximum, which is reached after about ⅔ of the duration of the scan; then it starts decreasing. Towards the end of the scan the controlled rectifier 9 is fired thus connecting to earth the coil 8. The current in the coil 8 and the capacitor 7 rises very rapidly to a value such that it exceeds the current taken by the coil 5; at this point the controlled rectifier 1 becomes reverse biased (switch off) and the diode 3 starts conducting; the current in coil 8, reaches its maximum, but rapidly drops to zero and goes negative so that the diode 3 also becomes reverse biased and starts the flyback, the flyback occurs mainly by the resonance of the coil 5 and the capacitor 6. Across the coil 5 a positive voltage half-wave develops, at the end of which the diode 3 becomes again conducting and the cycle restarts.

Immediately after the moment at which the diode 3 switches off the controlled rectifier 9 also becomes turned off.

The energy from the battery B+ arriving through the coil 11 and stored in the capacitor 7 during the line scan is released to the deflection circuit during the last part of the scan time, during the period when the rectifier 9 is conducting.

The advantages of the circuit described above, over known circuits of this type (such as that described in U.S. Pat. No. 3,452,244) lies in the fact that the coil 8 is always connected in series with the controlled rectifier 9 so that the variation of the current in time is always less severe than would be the case if it were connected as in the above-cited U.S. patent; moreover, the controlled rectifier 9 does not form part of the flyback circuit so that, inter alia, it is not necessary to provide a diode in parallel, to it. Another advantage lies in the fact that the functions of the flyback capacitor (6) and the switching capacitor (7) are completely separate, thus providing greater freedom in selecting the values of these. This means that, as a consequence, the efficiency of the circuit is improved.

It will be apparent that there are a number of variations which can be made to the circuit described above, without departing from the general principle of the invention. For example, the two impedance coils 8 and 11 could be changed for a transformer; and instead of using controlled rectifiers 1 and 9 transistors could be used.

W claim:

1. A circuit for generating a periodic saw-tooth waveform in a coil, such as the deflection coil of a television picture tube, comprising:
   a first circuit branch across which said deflection coil is connected, said first circuit branch including an energy storing current source, and a first electronic switch having a control electrode to which are fed control pulses which make said switch conductive during a part of the ramp portion of the saw-tooth waveform,
   a second branch of the circuit across which said deflection coil is also connected, said second circuit branch comprising:
   a second current source,
   a first reactance connected in series between said deflection coil and said second current source,
   a second electronic switch, and
   a second reactance connected in series with said second electronic switch between said second current source and said second electronic switch and also between said first reactance and said second electronic switch, said second electronic switch being fed with pulses which initiate the flyback portion of said saw-tooth waveform by turning on said second electronic switch towards the end of the ramp portion of said saw-tooth waveform to connect said first and second reactances to form a resonant circuit.

2. A circuit as in claim 1, wherein both said first and said second electronic switches are open during a substantial part of said flyback portion of said saw-tooth waveform.

3. A circuit as in claim 1, wherein there is connected a unidirectionally conductive element in series with said second current source to prevent, at least during part of the cycle, the reverse flow of the circuit current towards said second current source.

4. A circuit as in claim 1, wherein said first reactance is a capacitor.

5. A circuit as in claim 1, wherein said second reactance is an inductance.

6. A circuit as in claim 1, wherein said second electronic switch is a controllable rectifier.

7. A circuit as in claim 1, wherein said first reactance remains connected to said second current source when said second electronic switch closes to form said resonant circuit with said first and second reactances.

8. A circuit as in claim 1, wherein said second current source is a B+ supply.

9. A circuit as in claim 1, wherein said second electronic switch consists of a silicon controlled rectifier.

* * * * *